US010382033B2

(12) United States Patent
Singh

(10) Patent No.: US 10,382,033 B2
(45) Date of Patent: Aug. 13, 2019

(54) STRESS TOLERANT POWER SUPPLY VOLTAGE DETECTOR CIRCUIT OPERABLE OVER A WIDE RANGE OF POWER SUPPLY VOLTAGES

(71) Applicant: STMicroelectronics International N.V., Schiphol (NL)

(72) Inventor: Prashant Singh, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/653,034

(22) Filed: Jul. 18, 2017

(65) Prior Publication Data

US 2019/0025862 A1    Jan. 24, 2019

(51) Int. Cl.
H03K 17/22 (2006.01)
G05F 1/56 (2006.01)
G06F 1/30 (2006.01)
G06F 1/24 (2006.01)

(52) U.S. Cl.
CPC ............ *H03K 17/223* (2013.01); *G05F 1/56* (2013.01); *G06F 1/24* (2013.01); *G06F 1/30* (2013.01); *G06F 1/305* (2013.01); *H03K 17/22* (2013.01)

(58) Field of Classification Search
CPC ........ H03K 17/232; H03K 17/22; G06F 1/24; G06F 1/30; G06F 1/305
See application file for complete search history.

(56) References Cited

U.S. PATENT DOCUMENTS

| 5,814,995 | A  | * | 9/1998  | Tasdighi    | G01R 19/16542 |
|           |    |   |         |             | 324/431       |
| 5,920,182 | A  | * | 7/1999  | Migliavacca | G06F 1/24     |
|           |    |   |         |             | 323/282       |
| 6,157,171 | A  | * | 12/2000 | Smith       | G01R 19/16542 |
|           |    |   |         |             | 320/133       |
| 6,873,193 | B2 | * | 3/2005  | Kinoshita   | H03K 17/22    |
|           |    |   |         |             | 327/143       |
| 7,106,107 | B2 | * | 9/2006  | Bhattacharya| H03K 3/02337  |
|           |    |   |         |             | 327/206       |
| 7,911,191 | B2 | * | 3/2011  | Lewis       | G05F 1/46     |
|           |    |   |         |             | 323/273       |
| 8,102,168 | B1 | * | 1/2012  | Wong        | G05F 1/56     |
|           |    |   |         |             | 323/281       |

(Continued)

OTHER PUBLICATIONS

Burdia, et al., "Power-on reset circuit for SoC with multiple I/O power supplies," ISSCS 2011—International Symposium on Signals, Circuits and Systems Year: 2011 pp. 1-4, DOI: 10.1109/ISSCS.2011.5978691.

(Continued)

*Primary Examiner* — Thomas J. Hiltunen
(74) *Attorney, Agent, or Firm* — Crowe & Dunlevy

(57) ABSTRACT

A power supply voltage detector circuit monitors a ramping supply voltage and selectively enables a voltage divider for operation to divide the ramping supply voltage in response to the ramping supply voltage exceeding a first threshold. Additionally, a variable resistance of the voltage divider is changed in response to the ramping supply voltage exceeding a second threshold. A voltage output from the voltage divider is used to generate a bandgap voltage used as a reference voltage in comparison operations for controlling enabling of the voltage divider and selection of the variable resistance.

50 Claims, 3 Drawing Sheets

(56) References Cited

U.S. PATENT DOCUMENTS

| | | | | |
|---|---|---|---|---|
| 2007/0014176 A1* | 1/2007 | Krenzke | ............... | G11C 5/147 |
| | | | | 365/226 |
| 2008/0164937 A1* | 7/2008 | Kim | .......... | G05F 3/30 |
| | | | | 327/539 |
| 2009/0219066 A1* | 9/2009 | Shkidt | ............ | H03K 17/22 |
| | | | | 327/143 |
| 2010/0134085 A1* | 6/2010 | Nishida | ............ | H02M 3/1563 |
| | | | | 323/285 |
| 2012/0056666 A1* | 3/2012 | Ryu | ............ | G01R 31/2884 |
| | | | | 327/538 |
| 2016/0378129 A1* | 12/2016 | Abe | .......... | G05F 3/02 |
| | | | | 327/541 |

OTHER PUBLICATIONS

Burdia, et al., "On-chip power-on reset strategy and I/O power supply detection for VLSI circuits," 2009 International Symposium on Signals, Circuits and Systems Year: 2009 pp. 1-4, DOI: 10.1109/ISSCS.2009.5206160.

* cited by examiner

US 10,382,033 B2

STRESS TOLERANT POWER SUPPLY VOLTAGE DETECTOR CIRCUIT OPERABLE OVER A WIDE RANGE OF POWER SUPPLY VOLTAGES

TECHNICAL FIELD

The present invention relates to a power supply voltage detector circuit, such as for use in connection with a power on reset (POR) functionality, that is stress tolerant over a wide range of supply voltages.

BACKGROUND

As the process technology node continues to shrink, there is a corresponding reduction in the tolerable maximum power supply voltage for devices made at that node. For example, for transistors supported by a fully depleted semiconductor on insulator (SOI) substrate at the 28 nm process technology node, the tolerable maximum supply voltage for a 28 Å device at this node is 1.8V.

There is a need in the art for a power supply voltage detector circuit that is operable to detect over a wide range of supply voltages, for example, over a range of voltages from 1.65V to 3.6V which includes the conventionally used integrated circuit power supply voltages, without introducing any reliability issue to any device. The use of such a stress tolerable power supply voltage detector circuit advantageously does not impose constraints on the power on reset sequence for the various circuits included in a System on Chip (SoC) which would otherwise be needed to save devices from experiencing an overvoltage stress.

SUMMARY

In an embodiment, a circuit comprises: a voltage divider circuit coupled to receive a supply voltage and having a tap node, said voltage divider circuit including a variable resistance component controlled by a first control signal; a voltage generator circuit powered from the supply voltage node and configured to generate a first voltage that follows a voltage at the tap node; a reference voltage generator circuit powered by the first voltage and configured to generate a reference voltage; and a first comparison circuit configured to compare the reference voltage to a second voltage derived from the supply voltage and generate the first control signal for changing a resistance of the variable resistance component.

In an embodiment, a circuit comprises: a voltage divider circuit coupled to receive a ramping supply voltage and having a tap node configured to output a first voltage dependent on the ramping supply voltage and a variable resistance; a voltage generator circuit powered from the ramping supply voltage node and configured to generate a second voltage that follows the first voltage; a voltage regulator circuit powered by the second voltage and configured to generate a regulated reference voltage; and a comparison circuit configured to compare the regulated reference voltage to a third voltage that is a fraction of the ramping supply voltage and generate a control signal for changing the variable resistance when the third voltage exceeds the regulated reference voltage.

In an embodiment, a circuit comprises: a voltage divider circuit coupled to receive a ramping supply voltage and having a tap node configured to output a first voltage dependent on the ramping supply voltage; a voltage generator circuit powered from the ramping supply voltage node and configured to generate a second voltage that follows the first voltage; a voltage regulator circuit powered by the second voltage and configured to generate a regulated reference voltage; and a comparison circuit configured to compare the regulated reference voltage to a third voltage that is a fraction of the ramping supply voltage and generate a control signal for selectively enabling operation of the voltage divider circuit when the third voltage exceeds the regulated reference voltage.

BRIEF DESCRIPTION OF THE DRAWINGS

For a better understanding of the embodiments, reference will now be made by way of example only to the accompanying figures in which.

DETAILED DESCRIPTION

Figure 1:
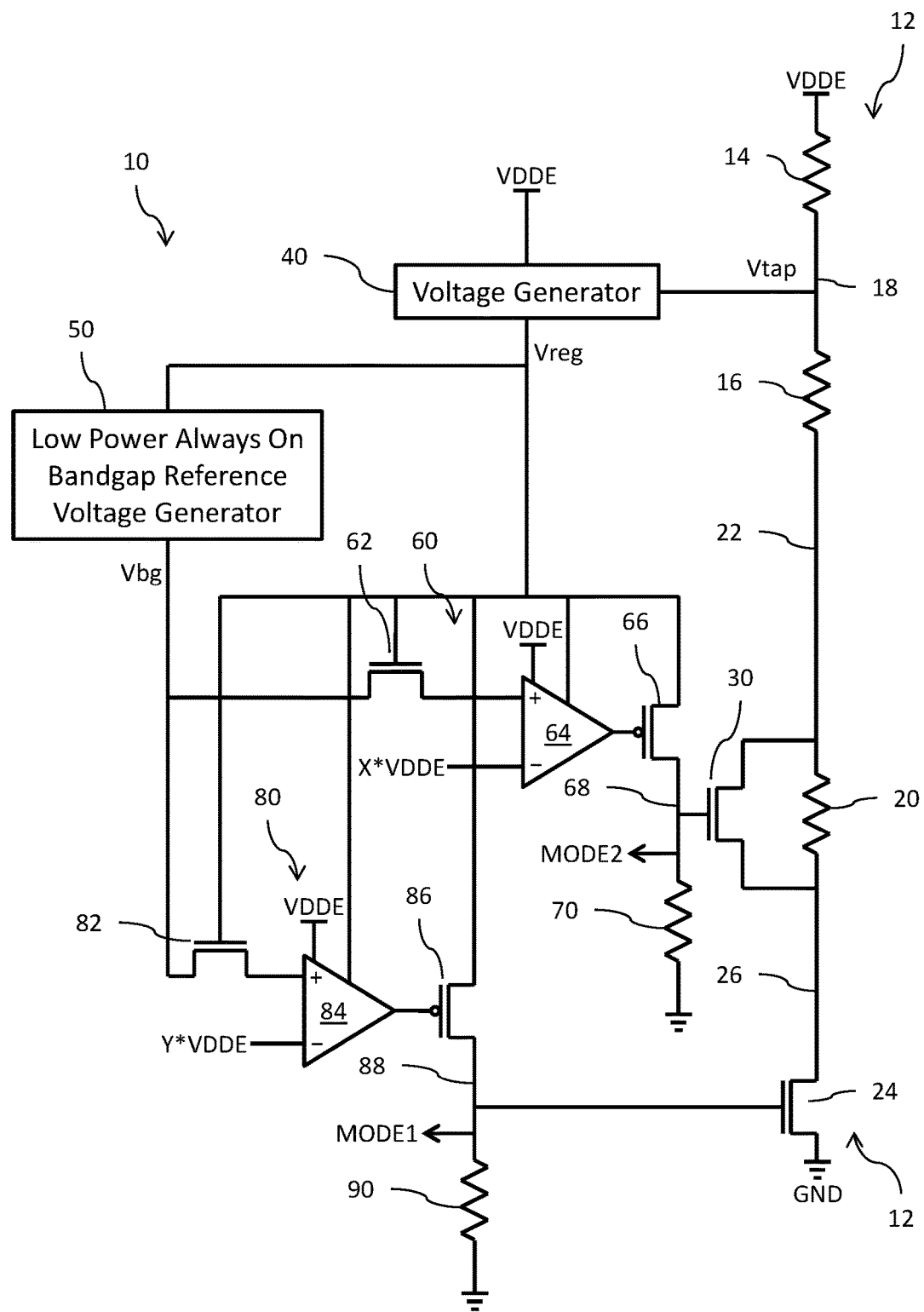
FIG. 1 is a circuit diagram of a stress tolerant power supply voltage detector circuit.

Reference is now made to FIG. 1 showing a circuit diagram of a stress tolerant power supply voltage detector circuit 10. The circuit 10 is a component of a System of Chip (SoC) type integrated circuit which includes a number of different circuit functionalities (for example, digital core circuitry, memory circuitry, analog circuitry, input/output (I/O) circuitry, and the like) which may have different power supply voltage needs. The sequence with which these various circuit functionalities of the SoC are enabled for operation in response to application of power at start-up is critical. To that end, it is conventional for the SoC to include power on reset (POR) circuits which monitor supply voltages and enable the various circuit functionalities for operation in a particular sequence and/or only when certain supply voltage levels are reached, so as to ensure that the SoC starts-up in a known and controlled state without affecting reliability properties of thin oxide devices used in the SoC.

The SoC main power supply is received at the power supply node VDDE which is coupled to the power supply voltage detector circuit 10. A voltage divider circuit 12 is coupled between the power supply node VDDE and the ground node GND. The voltage divider circuit 12 includes a resistor 14 coupled in series with a resistor 16 at node 18, a resistor 20 coupled in series with resistor 16 at node 22, and an n-channel MOSFET device 24 having a drain coupled to resistor 20 at node 26 and a source coupled to the ground node GND. The gate of transistor 24 is driven by a signal MODE1. When the drive signal MODE1 has a magnitude sufficient to turn on transistor 24, the voltage divider circuit 12 is enabled for operation. An n-channel MOSFET device 30 has a drain coupled to node 22 and a source coupled to node 26. The gate of transistor 30 is driven by a signal MODE2. When the drive signal MODE2 has a magnitude sufficient to turn on transistor 30, there is short circuit applied across the resistor 20 which changes the voltage division operating characteristics of the voltage divider circuit 12.

Node 18 is the tap node of the voltage divider circuit 12 and outputs a voltage Vtap that is dependent on the voltage VDDE and the resistances of the resistors 14, 16 and 20. When transistor 24 is not turned on, the voltage Vtap follows the voltage VDDE through the pull-up provided by resistor 14. When transistor 24 is turned on by the signal MODE1 and transistor 30 is not turned on by the signal MODE2, the voltage Vtap=VDDE((R16+R20)/(R14+R16+R20)), where R14 is the resistance of resistor 14, R16 is the resistance of resistor 16, and R20 is the resistance of resistor 20. When transistors 24 and 30 are both turned on in response to the MODE1 and MODE2 signals, the voltage Vtap=VDDE ((R16)/(R14+R16)). The resistors 16 and 20 accordingly form a variable resistance circuit whose effective resistance value is controlled by the signal MODE2 and the shorting operation performed by transistor 30. Although the variable resistance circuit is shown in FIG. 1 on the low side of tap node 18, it will be understood that the variable resistance circuit could alternatively be implemented on the high side of tap node 18 if desired.

Figure 2:
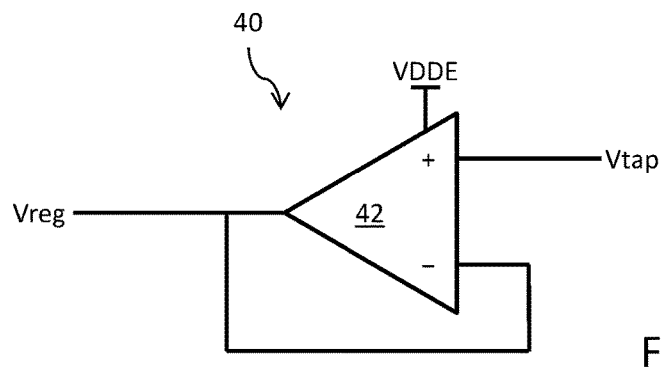
FIG. 2 is a circuit diagram for a voltage generator circuit.

The voltage detector circuit 10 further includes a voltage generator circuit 40 that is powered by the VDDE voltage and receives the Vtap voltage as a reference voltage. The voltage generator circuit 40 functions to generate an output voltage Vreg which tracks the Vtap voltage. FIG. 2 shows a circuit diagram for the voltage generator circuit 40 formed by an operational amplifier circuit 42 that is powered by VDDE and configured as a voltage follower with the Vtap voltage applied to the non-inverting amplifier input and the output of the amplifier, where the output voltage Vreg is generated, connected to the inverting amplifier input in negative feedback.

The Vreg voltage output from the voltage generator circuit 40 is provided as the supply voltage for a bandgap voltage generator circuit 50. The output voltage Vreg is considered in this context to be regulated by the negative feedback of the operational amplifier circuit 42 with a goal to maintain the voltage level of Vreg above a minimum operating supply voltage for the bandgap voltage generator circuit 50. The bandgap voltage generator circuit 50 is designed to output a regulated voltage Vbg. The bandgap voltage generator circuit 50 is a low-power (i.e., optimized by sizing of the transistors to consume low power from the Vreg supply), always on (i.e., it does not have enable or disable control circuits), type circuit that is well known to those skilled in the art.

The MODE2 signal is generated by a first comparison circuit 60. The first comparison circuit 60 includes an n-channel MOSFET device 62 having a source coupled to receive the bandgap voltage Vbg, a drain and a gate coupled to receive the voltage Vreg. The voltage Vreg biases the transistor 62 in the on state to pass the bandgap voltage Vbg to the transistor drain which is coupled to a first input of a voltage comparator circuit 64. In the event of a glitch in the voltage Vreg, which would also produce a glitch in the bandgap voltage Vbg, that glitch in the voltage Vreg would cause the conductivity of transistor 62 to change and thus filter the glitch in the bandgap voltage Vbg from reaching the first input of the voltage comparator circuit 64. The voltage at the first (non-inverting) input of the voltage comparator circuit 64 is the reference voltage against which voltage comparison is made. The second (inverting) input of the voltage comparator circuit 64 receives a first comparison (i.e., variable) voltage X*VDDE, where X is a first fractional value which sets the trip point X' (see, FIG. 4A) of the voltage comparator circuit 64. As an example, X may be less than about 0.4. The voltage comparator circuit 64 is powered by the VDDE voltage and has its operating bias controlled by the voltage Vreg. The output of the voltage comparator circuit 64 drives the gate of a p-channel MOSFET device 66 having a source coupled to the voltage Vreg and a drain coupled to node 68. A resistor 70 is coupled between node 68 and the ground node. The MODE2 signal is output from node 68.

The MODE1 signal is generated by a second comparison circuit 80. The second comparison circuit 80 includes an n-channel MOSFET device 82 having a source coupled to receive the bandgap voltage Vbg, a drain and a gate coupled to receive the voltage Vreg. The voltage Vreg biases the transistor 82 in the on state to pass the bandgap voltage Vbg to the transistor drain which is coupled to a first input of a voltage comparator circuit 84. In the event of a glitch in the voltage Vreg, which would also produce a glitch in the bandgap voltage Vbg, that glitch in the voltage Vreg would cause the conductivity of transistor 82 to change and thus filter the glitch in the bandgap voltage Vbg from reaching the first input of the voltage comparator circuit 84. The voltage at the first (non-inverting) input of the voltage comparator circuit 84 is the reference voltage against which voltage comparison is made. The second (inverting) input of the voltage comparator circuit 84 receives a second comparison (i.e., variable) voltage Y*VDDE, where Y is a second fractional value which sets the trip point Y' (see, FIG. 4A) of the voltage comparator circuit 84. As an example, Y may be less than about 0.6. The voltage comparator circuit 84 is powered by the VDDE voltage and has its operating bias controlled by the voltage Vreg. The output of the voltage comparator circuit 84 drives the gate of a p-channel MOSFET device 86 having a source coupled to the voltage Vreg and a drain coupled to node 88. A resistor 90 is coupled between node 88 and the ground node. The MODE1 signal is output from node 88.

Figure 3:
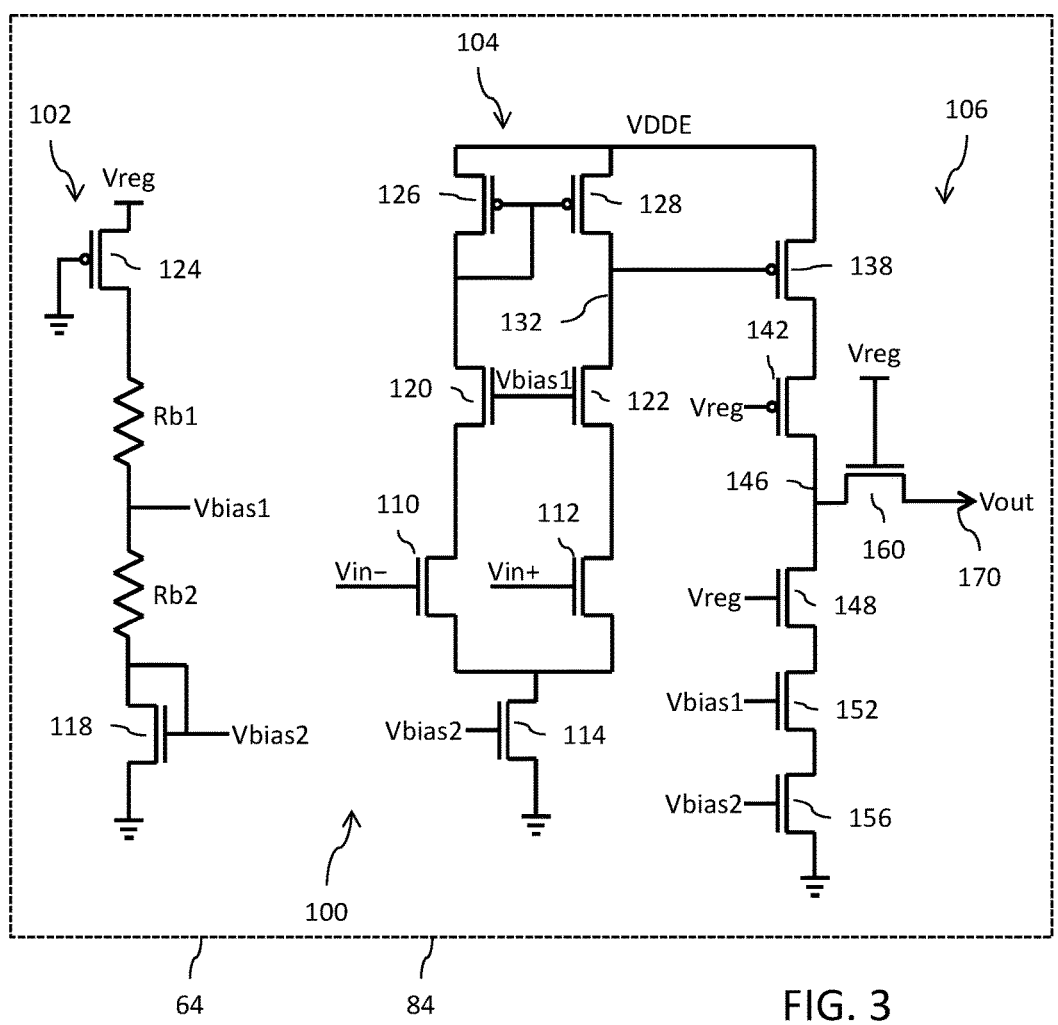
FIG. 3 is a circuit diagram of a voltage comparator circuit.

Reference is now made to FIG. 3 showing a circuit diagram of a voltage comparator circuit 100 that may be used for each of the voltage comparator circuits 64 and 84 of FIG. 1.

The voltage comparator circuit 100 includes a bias voltage generator circuit 102 that is powered by the voltage Vreg and configured to generate bias voltages Vbias1 and Vbias2 which are dependent on the voltage Vreg and a bias current generated by a p-channel transistor 124 (configured as a current source) and flowing through bias resistors Rb1 and Rb2.

The voltage comparator circuit 100 is a two stage circuit including a differential input stage 104 and a single ended output (gain) stage 106. The differential input stage 104 includes a pair of n-channel differential input transistors 110 and 112 with a common source connection to an n-channel tail current transistor 114. The differential input transistors 110 and 112 have gates coupled to receive, respectively, an input Vin− and an input Vin+. As an example, the input Vin+ is configured to receive the signal Vbg and an input Vin− configured to receive the signal X*VDDE for amplifier 64 and Y*VDDE for amplifier 84. The gate of the tail current transistor 114 is biased by the bias voltage Vbias2, with the transistor 114 coupled in a current mirror configuration with transistor 118 of the bias voltage generator circuit 102. The load of the differential input stage 104 includes a pair of n-channel cascode transistors 120 and 122 coupled in series with the pair of n-channel differential input transistors 110 and 112 and having common gates biased by the bias voltage Vbias1. The load further includes a current mirror circuit formed by a pair of p-channel transistors 126 and 128 coupled in series with the pair of n-channel cascode transistors 120 and 122. The output of the differential input stage 104 is taken at node 132.

The single ended output stage 106 has an input (coupled to node 132 at the output of the differential input stage 104)

at the gate of a p-channel transistor 138 whose source is coupled to the VDDE voltage. A p-channel cascode transistor 142 has its source coupled to the drain of transistor 138 and its drain coupled to node 146. The gate of the p-channel cascode transistor 142 is biased at Vreg. An n-channel transistor 148 has a drain coupled to node 146 and a gate that is biased by the voltage Vreg. An n-channel transistor 152 has a drain coupled to a source of transistor 148 and gate that is biased by the voltage Vbias1. An n-channel transistor 156 has a drain coupled to a source of transistor 152, a source coupled to the ground node and a gate that is biased by the voltage Vbias2. An n-channel transistor 160 has a source coupled to node 146, a gate that is biased by the voltage Vreg and a drain of transistor 160 coupled to output node 170.

The circuit 100 is a comparator circuit that uses thin oxide transistors and it is stress tolerant for a supply range of 1.8V to 3.6V. To obtain the gain from comparator and protect each transistor from electrical overstress, a cascoding structure (including transistors 126, 128, 120, 122, 138, 142, 148, 152, and 156) is used. The bias voltages Vbias1 and Vbias 2 are analog signals which enable transistors 114, 152 and 156 to act as current sources and transistor 148 is used to protect transistors 152 and 156 when supply (VDDE) voltage reaches to 3.6V. The maximum voltage at the drain of transistor 152 will be Vreg-Vth, so even at node 146 if the voltage rises to 3.6V the transistor 152 will be safe from electrical overstress. Similarly, transistor 160 is used to protect node 146 from electrical overstress.

Figure 4A:
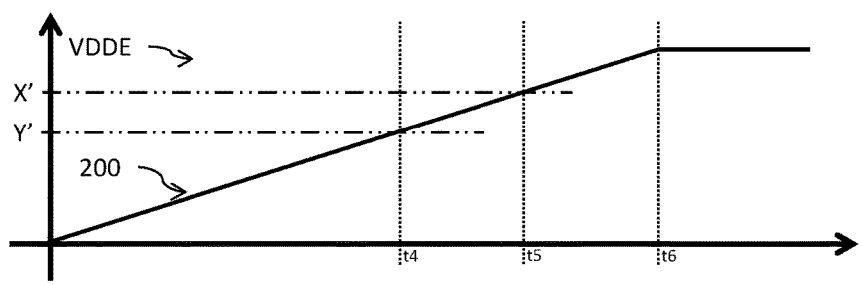
FIGS. 4A-4E are waveform traces illustrating operation of the voltage detector circuit of FIG. 1.

Operation of the voltage detector circuit 10 is as follows:

At start-up, the voltage VDDE begins to ramp up (reference 200, FIG. 4A).

Figure 4B:
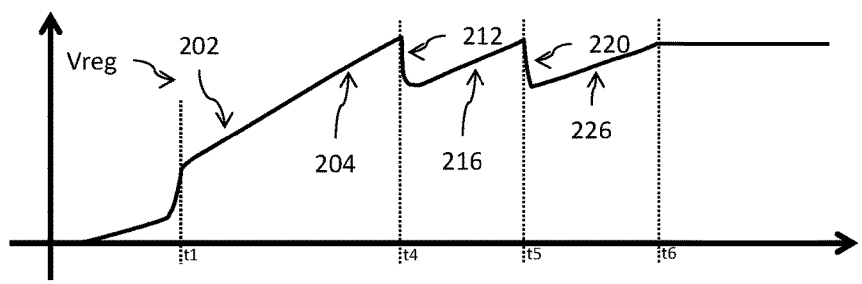

At about time t1, there is sufficient VDDE voltage for the voltage generator circuit 40 to operate as a voltage follower and the voltage Vreg ramps up and tracks the voltage VDDE (reference 202, FIG. 4B). It is important to note that the value of Vreg=Z*VDDE (where Z is a fractional value that is between 0.55 and 0.75.

Figure 4C:
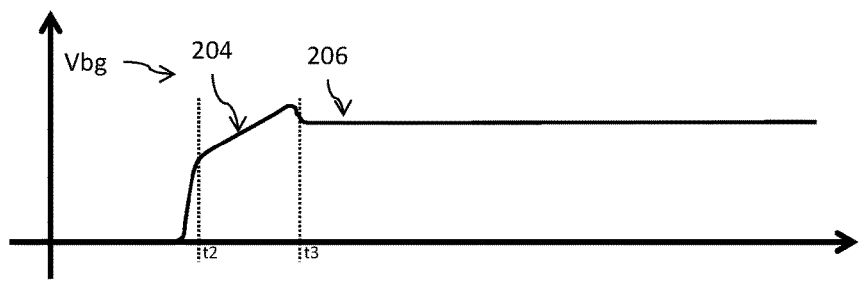

At about time t2, the bandgap voltage generator circuit 50 outputs the voltage Vbg which is not yet regulated but ramps up tracking the voltage Vreg (reference 204, FIG. 4C).

At about time t3, the bandgap voltage generator circuit 50 enters regulation and outputs the regulated voltage Vbg (reference 206, FIG. 4C).

Figure 4D:
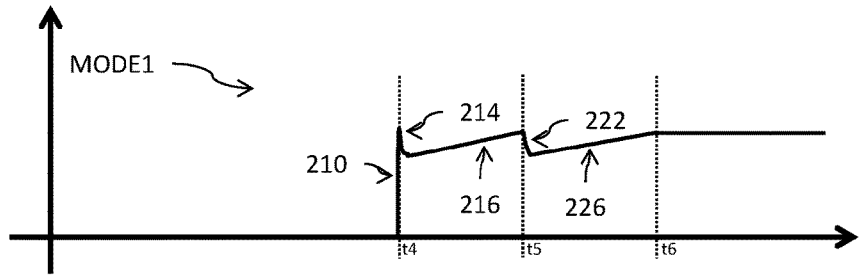

From start up through about time t4, the voltage divider circuit 12 is not yet enabled for operation. The resistor 90 holds the MODE1 signal at the gate of transistor 24 to ground, and thus transistor 24 is turned off. The tap voltage Vtap ramps with the ramping VDDE voltage, and thus the voltage Vreg output from the voltage generator circuit 40 will also continue to ramp and track the voltage VDDE (reference 208, FIG. 4B). The comparator 84 compares a fractional magnitude of the ramping voltage VDDE to the bandgap voltage Vbg. At about time t4, the fractional magnitude of the ramping voltage VDDE exceeds the bandgap voltage Vbg and the output of the comparator 84 changes. This turns on transistor 86 and the MODE1 signal rises to the voltage Vreg (reference 210, FIG. 4D). This causes the transistor 24 to turn on. The voltage divider circuit 12 is now enabled for operation. The tap voltage is now governed by the relationship Vtap=VDDE((R16+R20)/(R14+R16+R20)). This causes a drop in the voltage Vtap, along with a corresponding drop in the voltage Vreg which follows Vtap (reference 212, FIG. 4B). There is also a corresponding drop in the voltage of the MODE1 signal (reference 214, FIG. 4D), but this drop is not sufficient to change the conductivity of transistor 24 which remains turned on. The voltage Vreg and the voltage of the MODE1 signal then continue to ramp responsive to ramping of the VDDE voltage (reference 216).

The MODE1 signal provides information indicating that supply range 2.25V to 2.75V of VDDE is now activated. It is a normal indication, but importantly, the detection supply range (2.25V to 2.75V) indicated by the MODE1 signal is generated only by single supply VDDE. It does not require a power select pin or any other supply. This helps the SoC to wake up in power sequence mode without creating reliability issues for thin oxide devices and creating unnecessary glitch in the signal MODE1. For example, in other known prior art circuits a signal like the MODE1 signal is generated with the help of a minimum of two power supplies and supporting control pins which impose many constraints on SoC verifications with complex power sequence guidelines.

Figure 4E:
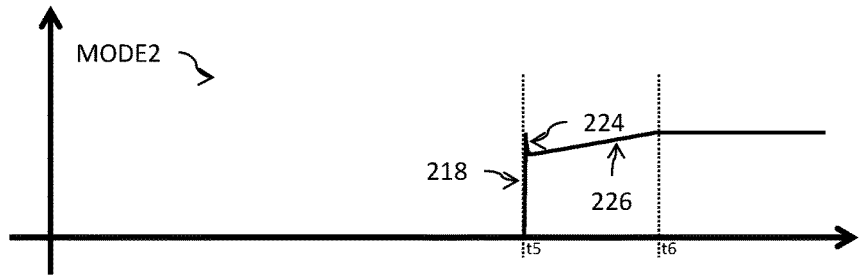

The comparator 64 compares a different fractional magnitude of the ramping voltage VDDE to the bandgap voltage Vbg. At about time t5, the fractional magnitude of the ramping voltage VDDE exceeds the bandgap voltage Vbg and turns on transistor 66. The MODE2 signal rises to the voltage Vreg (reference 218, FIG. 4E). This causes the transistor 30 to turn on and short circuit across resistor 20. The tap voltage Vtap is now governed by the relationship Vtap=VDDE((R16)/(R14+R16)). This causes a drop in the voltage Vtap, along with a corresponding drop in the voltage Vreg which follows Vtap (reference 220, FIG. 4B). There is also a corresponding drop in the voltage of the MODE1 signal (reference 222, FIG. 4D) and the MODE2 signal (reference 224, FIG. 4E). Neither of these voltage drops are sufficient to change the conductivity of transistors 24 and 30 which both remain turned on. The voltage Vreg, the voltage of the MODE1 signal, and the voltage of the MODE2 signal then continue to ramp responsive to ramping of the VDDE voltage (reference 226) until time t6 when the VDDE voltage stabilizes.

The MODE2 signal provides information indicating that supply range 3.0V to 3.6V for VDDE is now activated. It is a normal indication, but importantly, the detection supply range (3.0V to 3.6V) indicated by the MODE2 signal is generated only by single supply VDDE. It does not require a power select pin or any other supply. This helps the SoC to wake up in power sequence mode without creating reliability issues for thin oxide devices and creating unnecessary glitch in the signal MODE2. For example, in other known prior art circuits a signal like the MODE2 signal is generated with the help of a minimum of two power supplies and supporting control pins which impose many constraints on SoC verifications with complex power sequence guidelines.

The configuration and operation of the voltage divider circuit 12 and the voltage generator circuit 40 ensures that the voltage Vreg remains below a voltage level (for example, at or slightly below 2.0V and more specifically 1.8V in some embodiments) over a wide supply range of VDDE that will not stress the transistor devices used on the voltage detector circuit 10. Thus, the circuit design will be functional in high VDDE voltage environments even with 28 Å devices supported by a fully depleted semiconductor on insulator (SOI) substrate at the 28 nm process technology node.

The voltage comparator circuit 100 is used to compare a fraction of the supply voltage VDDE with the bandgap voltage. When the supply voltage VDDE is in a range from, for example, 2.25V to 2.75V, the comparator 84 turns on and its output goes from logic high to logic low. This turns on transistor 86 and the MODE1 signal rises. The MODE1 signal is initially set to zero (ground) voltage by pull down resistor 90 because when VDDE ramps up it must ensure that transistor 24 is not turned on before the supply voltage VDDE reaches 2.25V. So, the resistor 90 helps to initialize MODE1 from the ground level when VDDE begin to ramps up. Similarly, the comparator 64 detects the supply voltage VDDE in, for example, a range from 3.0 V to 3.6V. Here, the pull down resistor 70 helps to initialize the MODE2 signal from the ground level when VDDE begin to ramp up.

The transistors 62 and 82 of the voltage divider circuit 12 function as glitch filter devices. It is important to keep the reference voltage input to the two comparators 64 and 84 clean. The gates of transistors 62 and 82 are at the Vreg voltage and its value is, for example, between 1.6V to 1.98V. The threshold voltage of transistors 62 and 82 is maximum to 0.5V so transistors 62 and 82 will never be turned off because the gate to source voltage difference (Vreg−Vbg) will be always higher than 0.5V. The magnitude of the glitch in Vreg is controlled as discussed herein because the voltage generator is configured in negative feedback. The purpose of transistors 62 and 82 is to provide a momentarily high resistance between Vbg and the input of the comparators 64 and 84, respectively, by changing the source-drain conductivity. As a result, this momentarily high resistance in combination with the gate capacitance at the input of the comparator acts as a low pass filter circuit and the magnitude of glitch in Vbg is reduced. The higher resistance of transistors 62 and 82 arises as a result of the voltage glitch in the Vreg signal. When Vreg falls in the glitch event, the overdrive voltage of transistors 62 and 82 is reduced and as a result the magnitude of glitch in Vbg is reduced.

In a preferred implementation, the bandgap voltage generator is configured for self start-up in a manner known to those skilled in the art. The voltage detector circuit 10 is designed with a self-feedback loop which means that the circuit uses only a single supply to detect its own power. No other external control is present to enable or start the feedback loop.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A circuit, comprising:
    a voltage divider circuit coupled to receive an input supply voltage and having a tap node generating a first reference voltage which is a fraction of the input supply voltage, said voltage divider circuit including a variable resistance component controlled by a first control signal;
    a voltage generator circuit powered from the input supply voltage and receiving the first reference voltage, said voltage generator circuit configured to generate a first voltage that follows said first reference voltage;
    a reference voltage generator circuit powered by the first voltage and configured to generate a second reference voltage; and
    a first comparison circuit configured to compare the second reference voltage to a second voltage derived from the input supply voltage and generate the first control signal for changing a resistance of the variable resistance component.

2. The circuit of claim 1, wherein the second voltage is a first fraction of the input supply voltage.

3. The circuit of claim 1, wherein the voltage generator circuit is voltage follower circuit configured to generate the first voltage equal to the voltage at the tap node.

4. The circuit of claim 3, wherein the reference voltage generator circuit is a bandgap voltage generator and the second reference voltage is a regulated bandgap voltage.

5. The circuit of claim 1, wherein the first comparison circuit includes a voltage comparator powered by the input supply voltage and biased in response to the first voltage.

6. The circuit of claim 5, wherein the first comparison circuit further includes an output transistor powered by the first voltage, having a control terminal coupled to an output of the voltage comparator and having an output configured to generate the first control signal.

7. The circuit of claim 5, wherein the first comparison circuit further includes a pass transistor having a source-drain path coupling the second reference voltage to a first input of the voltage comparator, with a second input of the voltage comparator coupled to receive the second voltage derived from the input supply voltage, a control terminal of the pass transistor driven by the first voltage.

8. The circuit of claim 1, wherein the variable resistance component of the voltage divider circuit comprises:
    a resistor coupled to said tap node; and
    a transistor coupled in parallel with said resistor and having a control terminal driven by said first control signal to selectively short around the resistor and change the resistance of the variable resistance component.

9. The circuit of claim 1, wherein, in response to a ramping of the input supply voltage, the first comparison circuit delays generating the first control signal to change the resistance of the variable resistance component until the input supply voltage exceeds a threshold.

10. A circuit, comprising:
    a voltage divider circuit coupled to receive a supply voltage and having a tap node, said voltage divider circuit including a variable resistance component controlled by a first control signal, wherein said voltage divider circuit is further selectively enabled for operation in response to a second control signal;
    a voltage generator circuit powered from the supply voltage and configured to generate a first voltage that follows a voltage at the tap node;
    a reference voltage generator circuit powered by the first voltage and configured to generate a reference voltage; and
    a first comparison circuit configured to compare the reference voltage to a second voltage derived from the supply voltage and generate the first control signal for changing a resistance of the variable resistance component; and
    a second comparison circuit configured to compare the reference voltage to a third voltage derived from the supply voltage and generate the second control signal for enabling the voltage divider circuit.

11. The circuit of claim 10, wherein the third voltage is a fraction of the supply voltage.

12. The circuit of claim 10, wherein the second voltage is a first fraction of the supply voltage and the third voltage is a second fraction of the supply voltage.

13. The circuit of claim 12, wherein, in response to a ramping of the supply voltage, the second comparison circuit generates the second control signal for enabling the voltage divider circuit prior in time to the first comparison circuit generating the first control signal to select the resistance of the variable resistance component.

14. The circuit of claim 10, wherein the second comparison circuit includes a voltage comparator powered by the supply voltage and biased in response to the first voltage.

15. The circuit of claim 14, wherein the second comparison circuit further includes an output transistor powered by the first voltage, having a control terminal coupled to an output of the voltage comparator and having an output configured to generate the second control signal.

16. The circuit of claim 14, wherein the second comparison circuit further includes a pass transistor having a source-drain path coupling the reference voltage to a first input of the voltage comparator, with a second input of the voltage comparator coupled to receive the third voltage derived from the supply voltage, a control terminal of the pass transistor driven by the first voltage.

17. The circuit of claim 10, wherein, in response to a ramping of the supply voltage, the second comparison circuit delays generating the second control signal to enable operation of the voltage divider circuit until the supply voltage exceeds a threshold.

18. The circuit of claim 10, wherein, in response to a ramping of the supply voltage:
the second comparison circuit delays generating the second control signal to enable operation of the voltage divider circuit until the supply voltage exceeds a first threshold; and
the first comparison circuit delays generating the first control signal to change the resistance of the variable resistance component until the supply voltage exceeds a second threshold, wherein the second threshold is greater than the first threshold.

19. A circuit, comprising:
a voltage divider circuit coupled to receive a ramping input supply voltage and having a tap node configured to output a first voltage that is a first fraction of the ramping input supply voltage, wherein said first fraction is set by a variable resistance;
a voltage generator circuit powered from the ramping input supply voltage and configured to generate a second voltage that follows the first voltage;
a voltage regulator circuit powered by the second voltage and configured to generate a regulated reference voltage; and
a comparison circuit configured to compare the regulated reference voltage to a third voltage that is a second fraction of the ramping supply voltage and generate a control signal for changing the variable resistance when the third voltage exceeds the regulated reference voltage.

20. The circuit of claim 19, wherein the voltage generator circuit is voltage follower circuit configured to generate the second voltage equal to the first voltage.

21. The circuit of claim 19, wherein the voltage regulator circuit is a bandgap voltage generator and the regulated reference voltage is a bandgap voltage.

22. The circuit of claim 19, wherein the comparison circuit includes a voltage comparator powered by the ramping input supply voltage and biased in response to the second voltage.

23. The circuit of claim 22, wherein the comparison circuit further includes an output transistor powered by the second voltage, having a control terminal coupled to an output of the voltage comparator and having an output configured to generate the control signal.

24. The circuit of claim 22, wherein the comparison circuit further includes a pass transistor having a source-drain path coupling the regulated reference voltage to a first input of the voltage comparator, with a second input of the voltage comparator coupled to receive the third voltage derived from the ramping input supply voltage, a control terminal of the pass transistor driven by the second voltage.

25. The circuit of claim 19, wherein the voltage divider circuit includes:
a resistor coupled to said tap node; and
a transistor coupled in parallel with said resistor and having a control terminal driven by said control signal to selectively short around the resistor and change the variable resistance.

26. The circuit of claim 19, wherein the comparison circuit delays generating the control signal to change the variable resistance until the ramping input supply voltage exceeds a threshold.

27. A circuit, comprising:
a voltage divider circuit coupled to receive a ramping supply voltage and having a tap node configured to output a first voltage dependent on the ramping supply voltage;
a voltage generator circuit powered from the ramping supply voltage and configured to generate a second voltage that follows the first voltage;
a voltage regulator circuit powered by the second voltage and configured to generate a regulated reference voltage; and
a comparison circuit configured to compare the regulated reference voltage to a third voltage that is a fraction of the ramping supply voltage and generate a control signal for selectively enabling operation of the voltage divider circuit when the third voltage exceeds the regulated reference voltage.

28. The circuit of claim 27, wherein the voltage generator circuit is voltage follower circuit configured to generate the second voltage equal to the first voltage.

29. The circuit of claim 27, wherein the voltage regulator circuit is a bandgap voltage generator and the regulated reference voltage is a bandgap voltage.

30. The circuit of claim 27, wherein the comparison circuit includes a voltage comparator powered by the ramping supply voltage and biased in response to the second voltage.

31. The circuit of claim 30, wherein the comparison circuit further includes an output transistor powered by the second voltage, having a control terminal coupled to an output of the voltage comparator and having an output configured to generate the control signal.

32. The circuit of claim 30, wherein the comparison circuit further includes a pass transistor having a source-drain path coupling the regulated reference voltage to a first input of the voltage comparator, with a second input of the voltage comparator coupled to receive the third voltage derived from the ramping supply voltage, a control terminal of the pass transistor driven by the second voltage.

33. The circuit of claim 27, wherein the voltage divider circuit includes:
a resistor coupled to said tap node; and
a transistor coupled in series with said resistor and having a control terminal driven by said control signal to selectively connect the voltage divider circuit to a ground reference node and enable voltage divider circuit operation.

34. The circuit of claim 27, wherein the comparison circuit delays generating the control signal to enable the voltage divider circuit until the ramping supply voltage exceeds a threshold.

35. The circuit of claim 10, wherein the second voltage is a first fraction of the supply voltage.

36. The circuit of claim 10, wherein the voltage generator circuit is voltage follower circuit configured to generate the first voltage equal to the voltage at the tap node.

37. The circuit of claim 36, wherein the reference voltage generator circuit is a bandgap voltage generator and the reference voltage is a regulated bandgap voltage.

38. The circuit of claim 10, wherein the first comparison circuit includes a voltage comparator powered by the supply voltage and biased in response to the first voltage.

39. The circuit of claim 38, wherein the first comparison circuit further includes an output transistor powered by the first voltage, having a control terminal coupled to an output of the voltage comparator and having an output configured to generate the first control signal.

40. The circuit of claim 38, wherein the first comparison circuit further includes a pass transistor having a source-drain path coupling the reference voltage to a first input of the voltage comparator, with a second input of the voltage comparator coupled to receive the second voltage derived from the supply voltage, a control terminal of the pass transistor driven by the first voltage.

41. The circuit of claim 10, wherein the variable resistance component of the voltage divider circuit comprises:
   a resistor coupled to said tap node; and
   a transistor coupled in parallel with said resistor and having a control terminal driven by said first control signal to selectively short around the resistor and change the resistance of the variable resistance component.

42. The circuit of claim 10, wherein, in response to a ramping of the supply voltage, the first comparison circuit delays generating the first control signal to change the resistance of the variable resistance component until the supply voltage exceeds a threshold.

43. A circuit, comprising:
   a voltage divider circuit coupled to receive a supply voltage and having a tap node, said voltage divider circuit including a variable resistance component controlled by a first control signal;
   a voltage generator circuit powered from the supply voltage and configured to generate a first voltage that follows a voltage at the tap node, wherein the voltage generator circuit is voltage follower circuit configured to generate the first voltage equal to the voltage at the tap node;
   a reference voltage generator circuit powered by the first voltage and configured to generate a reference voltage; and
   a first comparison circuit configured to compare the reference voltage to a second voltage derived from the supply voltage and generate the first control signal for changing a resistance of the variable resistance component.

44. The circuit of claim 43, wherein the second voltage is a first fraction of the supply voltage.

45. The circuit of claim 43, wherein the reference voltage generator circuit is a bandgap voltage generator and the reference voltage is a regulated bandgap voltage.

46. The circuit of claim 43, wherein the first comparison circuit includes a voltage comparator powered by the supply voltage and biased in response to the first voltage.

47. The circuit of claim 46, wherein the first comparison circuit further includes an output transistor powered by the first voltage, having a control terminal coupled to an output of the voltage comparator and having an output configured to generate the first control signal.

48. The circuit of claim 46, wherein the first comparison circuit further includes a pass transistor having a source-drain path coupling the reference voltage to a first input of the voltage comparator, with a second input of the voltage comparator coupled to receive the second voltage derived from the supply voltage, a control terminal of the pass transistor driven by the first voltage.

49. The circuit of claim 43, wherein the variable resistance component of the voltage divider circuit comprises:
   a resistor coupled to said tap node; and
   a transistor coupled in parallel with said resistor and having a control terminal driven by said first control signal to selectively short around the resistor and change the resistance of the variable resistance component.

50. The circuit of claim 43, wherein, in response to a ramping of the supply voltage, the first comparison circuit delays generating the first control signal to change the resistance of the variable resistance component until the input supply voltage exceeds a threshold.

* * * * *